United States Patent [19]

Feldman

[11] Patent Number: 4,983,981

[45] Date of Patent: Jan. 8, 1991

[54] ACTIVE ARRAY ELEMENT AMPLITUDE STABILIZATION

[75] Inventor: Paul H. Feldman, Commack, N.Y.

[73] Assignee: Hazeltine Corporation, Greenlawn, N.Y.

[21] Appl. No.: 314,745

[22] Filed: Feb. 24, 1989

[51] Int. Cl.[5] ........................ H01Q 3/00; G01R 21/00; H03C 1/62

[52] U.S. Cl. .................................... 342/372; 343/703; 455/115

[58] Field of Search ............... 342/368, 372, 371, 378, 342/387, 351, 360; 343/703; 455/115

[56] References Cited

U.S. PATENT DOCUMENTS 4,176,354 11/1979 Hsiao et al. ......................... 342/173
4,359,779 11/1982 Levine ................................ 455/110
4,392,245 7/1983 Mitama ............................... 455/115
4,521,912 6/1985 Franke et al. ....................... 455/115

*Primary Examiner*—Gregory C. Issing
*Attorney, Agent, or Firm*—E. A. Onders

[57] ABSTRACT

An amplitude control system particularly suitable for an active antenna array includes a power detector for generating a power level signal representative of a level of radio frequency (RF) energy radiated by an antenna element, or groups of elements, in a phased antenna array. A reference signal corresponding to a desired value for the radiated level of RF energy is set by a control device, and the power level signal and the reference signal are compared with one another. Depending on the comparison result, an attenuator associated with an RF amplifier than drives the antenna elements, is adjusted to maintain the radiated RF energy at the desired value set at the control device.

19 Claims, 3 Drawing Sheets

ACTIVE ARRAY ELEMENT AMPLITUDE STABILIZATION

BACKGROUND OF THE INVENTION

1. Field of the Invention

The present invention relates generally to radiation amplitude control or stabilization systems for antenna elements, and particularly to a radio frequency (RF) amplitude stabilization system for antenna elements of an active phased array antenna.

2. Description of the Known Art

In an active phased element antenna array, a number of antenna elements are each driven by an associated RF amplifier that may be in the form of a GaAs integrated circuit. The phase of RF energy applied to the input of each amplifier is controlled to provide a desired beam direction for the sum of the RF energy radiated by all elements of antenna array at a given moment. The amplitude of RF energy fed to each individual element is often pre-set to obtain a desired "taper", for example, with elements at the center portion of the array excited at a higher level of RF energy than elements situated at the outer periphery of the array.

In the past, conventional RF or microwave power dividers were used to implement a desired array taper. For active arrays, however, the amplitude taper is controlled, to a large degree, by the tolerances of the array components themselves, which are not sufficient to realize the accuracies required in applications such as microwave landing systems (MLS) at reasonable cost. Such systems require at least two phased array antennas adjacent an aircraft runway for causing both an azimuth (AZ) beam and an elevation (EL) beam to be scanned rapidly "to" and "fro", and "up" and "down", respectively. Equipment on board an aircraft approaching the runway receives the beams as scanned by the antennas and, based on synchronization information obtained from a third runway antenna, calculates the aircraft heading and angle of descent relative to the runway.

Understandably, malfunctions in the array elements that might cause an error in the beam steering operation of either the AZ or the EL antenna, will result in the computation of false positional information by the aircraft equipment during the critical runway approach time of flight.

A known method of securing a pre-set amplitude taper for the elements of a phased array antenna involves implementing a leveling or AGC loop to control the output power of the amplifier associated with each element. This technique has, however, two limitations, namely (1) loop response time, and (2) complexity. A third problem involves the accuracy with which the desired radiated RF energy from each element can be set. MLS applications require that such power setting accuracy be on the order of 1.5 db.

Another element tapering method involves "tweaking" each element to give the proper output power. This method is expensive and has limited dynamic and temperature ranges.

It is, therefore, an object of the present invention to overcome the above and other shortcomings of known methods of establishing a desired amplitude taper for antenna elements in a phased array.

A further object is to provide a technique that allows setting a desired RF output power level from an antenna element with high accuracy.

Another object of the invention is to provide a system in which the amplitude of RF power radiated by an antenna element is precisely controlled through digital techniques.

SUMMARY OF THE INVENTION

According to one aspect of the invention, an antenna element amplitude stabilization system includes amplifier means for supplying radio frequency (RF) energy to an antenna element, and power detector means for detecting a level of RF energy radiated by the element and generating a corresponding power level signal. Control means sets a reference signal corresponding to a desired value for the level of radiated RF energy, and comparing means, responsive to the power level signal and to the reference signal, produces an enable signal when one of the power level and reference signals is greater than the other. Attenuator means, coupled to the amplifier means and responsive to the enable signal, maintains the level of RF energy radiated by the antenna element at the desired value set by the control means.

According to another aspect of the invention, an amplitude stabilization system for a group of antenna elements in a phased array includes a number of amplifier means, each for supplying RF energy to a corresponding antenna element of a group of elements in a phased array. Combining means, coupled to the outputs of the amplifier means, samples the RF energy from each amplifier means and produces a corresponding output. Power detector means, coupled to the output of the combining means, generates a combined power level signal corresponding to the level of RF energy radiated. Control means sets a reference signal corresponding to a desired value of the radiated RF energy, and comparing means, responsive to the combined power level signal and to the reference signal, produces an enable signal when one of the combined power level and reference signals is greater than the other. A number of attenuator means, each associated with a different one of the amplifier means and responsive to the enable signal, maintains the level of radiated RF energy at the desired value set by the control means.

According to a further aspect of the invention, an amplitude stabilization system for an antenna element includes amplifier means for supplying RF energy to an antenna element, and power detector means for detecting a level of radiated RF energy and for generating a corresponding power level signal. Control means sets a first reference signal corresponding to a desired minimum value for the level of radiated RF energy, and sets a second reference signal corresponding to a desired maximum value for the radiated RF energy level. Comparing means, responsive to the power level signal and to the first and second reference signals, produces a first enable signal when the first reference signal is greater than the power level signal and a second enable signal when the power level signal is greater than the second reference signal. Attenuator means, associated with the amplifier means and responsive to the first and second enable signals, maintains the level of radiated RF energy between the desired minimum and maximum values set by the control means.

For a better understanding of the present invention, together with other and further objects, reference is made to the following description, taken in conjunction with the accompanying drawings, and its scope will be pointed out in the appended claims.

DETAILED DESCRIPTION OF THE INVENTION

Figure 1:
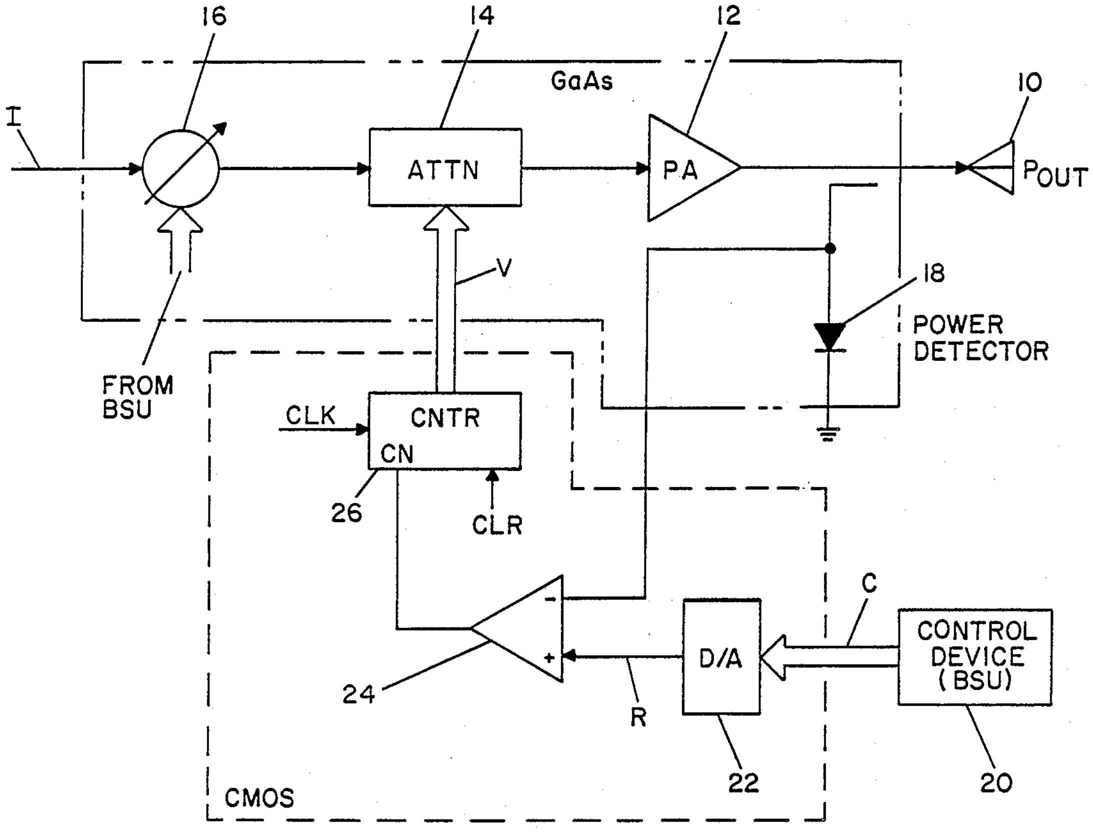
FIG. 1 is a block diagram of a first embodiment of an antenna element amplitude stabilization system according to the invention.

FIG. 1 is a block diagram of a radiation amplitude stabilization technique according to a first embodiment of the invention.

An individual antenna element 10 is excited with radio frequency (RF) energy from the output of a power amplifier 12. The antenna element 10 is one of a group of like elements forming a phased array antenna.

RF energy is applied to the input of amplifier 12 from the output of a controllable attenuator 14. Attenuator 14 provides an attenuation to the level of which is set by an applied analog voltage V. RF energy is applied to the input of attenuator 14 from an output of a phase shifter 16 the input of which is supplied with RF energy, such as from a relatively low power (less than one watt) source (not shown). Phase shifter 16 sets a predetermined phase shift at the input of attenuator 14, so that the phase of RF energy radiated by the antenna element 10 will be in a predetermined relation with the phases of other like elements of the phased array at a given time. Phase shifter 16 is controlled to set the desired instantaneous phase shift by an output signal from a beam steering unit (BSU), the details of which are well known to those skilled in the art.

The RF energy radiated by antenna element 10 is sampled and detected by power detector 18, which may be a conventional diode detector.

Power amplifier 12, attenuator 14, phase shifter 16 and power detector 18 all may be formed as an integrated GaAs monolithic device, as outlined by the two-dot dashed lines in FIG. 1. In typical applications, such as an MLS, the power output requirement for amplifier 12 need be only about one-quarter watt or less. The input to the phase shifter 16 may be obtained simply from a tap off of a waveguide coupled to the low level common power source (not shown). Understandably, by providing an "active" RF excitation module comprising the elements 12, 14, 16 and 18 for each antenna element 10 of a phased array, both the phase and the amplitude level of RF energy radiated by each element 10 can be adjusted to obtain a scanning beam of desired characteristics.

A desired value for the level of RF energy to be radiated by each antenna element 10 is set by a control device 20 that, according to the invention, can be incorporated within the digital electronics forming the BSU for a phased array antenna. For example, control device 20 may set relatively higher amplitude levels for those elements 10 at the center of the array, while allowing the radiation amplitude for the elements at the outer periphery of the array to diminish according to certain mathematical functions known in the art in order to provide the desired taper. By such tapering, the beam pattern is improved by reducing side-lobes that might be mistaken for the main beam by airborne receiving equipment.

A digital control signal set by the control device 20 is supplied to a digital-to-analog (D/A) converter 22. D/A converter 22 then generates a corresponding reference signal (R) that is applied to one input of a comparator 24. The output of the power detector 18, indicative of the actual radiated RF energy, is applied to the remaining input of comparator 24.

The output of comparator 24 is supplied to an "enable" terminal of a counter 26. Counter 26 also has input terminals for receiving a clock signal and a clear or reset signal. Counter 26 has an associated D/A converter that supplies the analog voltage (V) for controlling the setting of the attenuator 14. The clock and the clear signals may also originate from appropriate circuitry within control device 20.

All the elements 22, 24 and 26 can be formed as an integrated CMOS circuit compatible with the monolithic GaAs circuit that excites the antenna element 10.

Operation of the system depicted in FIG. 1 will now be described.

The control device 20 sets the D/A converter 22 so as to produce a reference signal (R) representing a desired output from the array element 10. Attenuator 14 is then set to maximum attenuation (minimum power out) by clearing counter 26. Counter 26, driving attenuator 14, is then allowed to increment one bit at a time in response to the clock signal. When the output power from amplifier 12 exceeds the reference level by one LSB (least significant bit) of the attenuator 14 or less, as detected by power detector 18, the comparator 24 disables the counter 26, i.e., no "enable" signal is supplied to the counter 26 from comparator 24. The proper output level for element 10 is thus achieved.

In addition to relatively easy implementation, the arrangement of FIG. 1 has a number of other advantages over conventional leveling loops. First, there are no loop bandwidth limitations, and no sample and hold circuits are needed to "save" a reference level during pulsed conditions (as exist in MLS).

Second, attenuator 14 need not have linear characteristics, thus eliminating the need for mapping PROMS. Finally, since attenuator 14 is controlled through D/A converter 22, eight bits of accuracy can be realized, which is far better than the 1.5 db presently obtainable.

Prefdrably, counter 21 is periodically cleared by a signal from the control device 20 to allow the process to repeat at determined intervals, thereby correcting for temperature and component aging.

Also, the clocking period for counter 26 must not be less than the response time required to obtain the corresponding power level signal from detector 18 and the resulting response from comparator 24.

Figure 2:
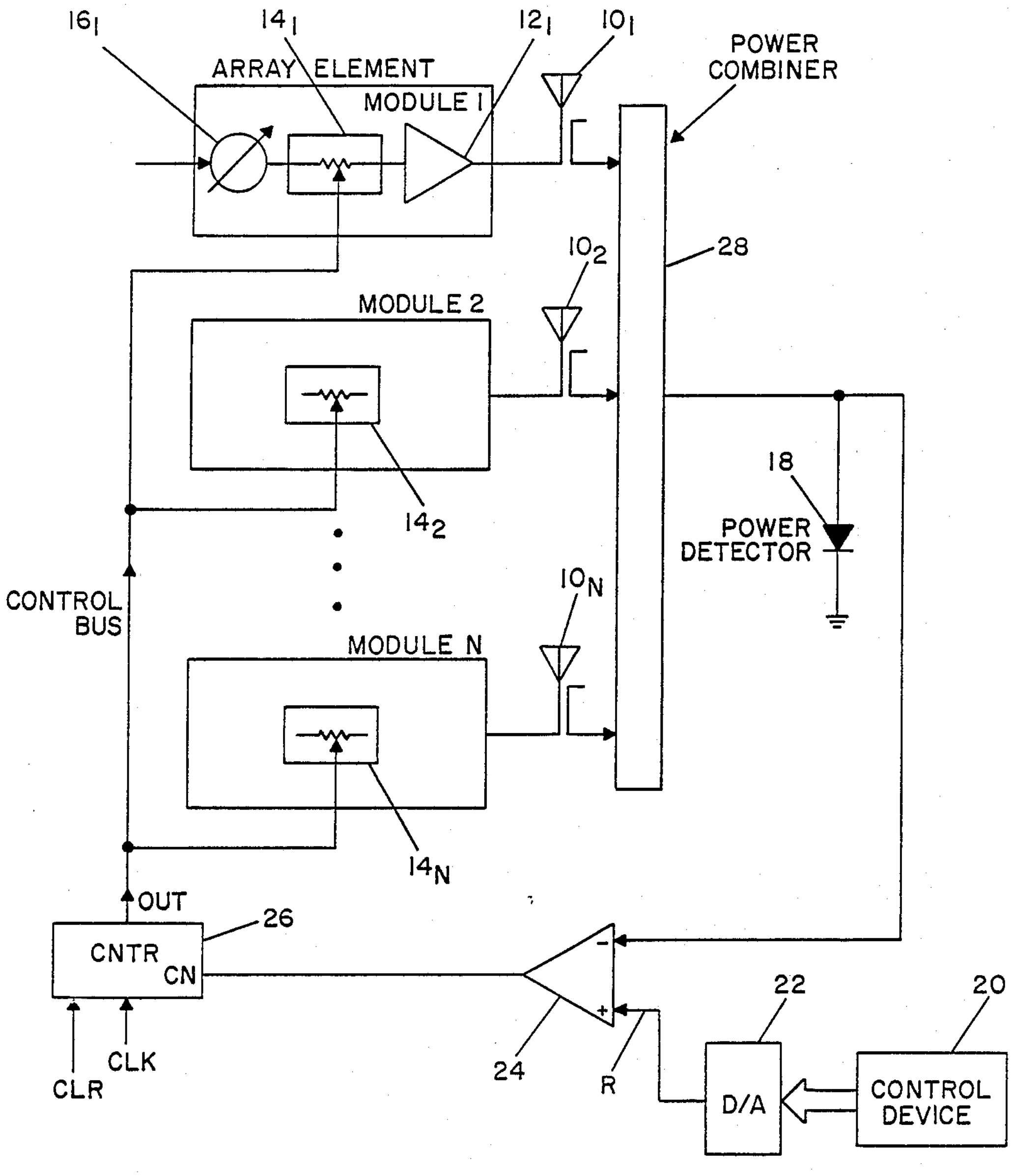
FIG. 2 is a block diagram of a second embodiment of an antenna element amplitude stabilization system according to the invention.

FIG. 2 is a block diagram illustrating a radiation amplitude stabilization technique according to a second embodiment of the invention. Components similar to those described above in connection with FIG. 1 have corresponding reference characters in FIG. 2.

The arrangement of FIG. 2 enables implementation of amplitude stabilization for a number of antenna elements $10_1$, $10_2$, . . . $10_N$, but requires only one D/A converter 22, one counter 26 and one power detector 18 (in the form of a diode). RF energy fed to each of the antenna elements 10 is coupled to a corresponding input of a power combiner 28. Combiner 28 produces an output corresponding to the total energy radiated by the elements 10, which output is detected by the power detector 18 for generating a combined power level signal corresponding to the level of RF energy radiated by the group of elements 10.

Understandably, the FIG. 2 embodiment achieves a significant improvement in both performance and ease of implementation (cost) for active (e.g., GaAs and other) phased array antennas. As with the FIG. 1 embodiment, the counter 26 is periodically cleared to allow each attenuator $14_N$ to run from maximum attenuation to a level just sufficient to obtain the desired output power from each amplifier $12_N$. As mentioned, such periodic cycling allows corrections for temperature and component aging that might otherwise allow the output power from each amplifier 12 to increase without any compensating adjustment of the associated attenuator 14.

Figure 3:
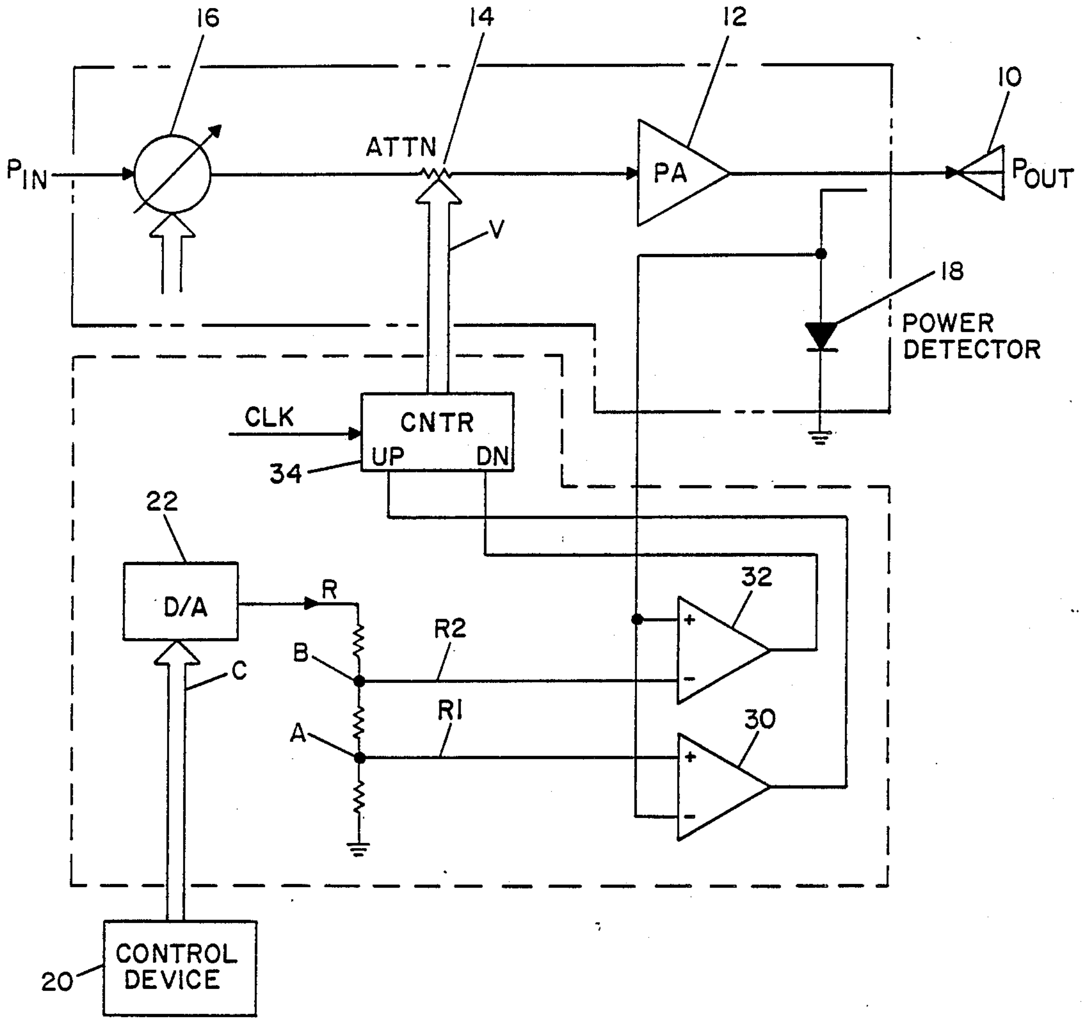
FIG. 3 is a block diagram of a third embodiment of an antenna element amplitude stabilization system according to the invention.

An arrangement in which both losses and increases of excitation power to each of the antenna elements 10 can be corrected to the desired set power level, is shown in FIG. 3. Components similar to those described and shown in FIG. 1 have corresponding reference characters in FIG. 3.

In the FIG. 3 embodiment, a first comparator 30 and a second comparator 32 are provided. Counter 34 is an "up-down" counter, responsive to either of an "up" enable input and a "down" enable input. When enabled, the counter 34 runs at a rate determined by a clock signal applied to another input terminal.

Instead of providing a reference signal corresponding to a desired value for the level of RF energy radiated by each antenna element 10, the D/A converter 22 produces a first reference signal (R1) corresponding to a desired minimum value for the RF energy level, and a second reference signal (R2) corresponding to a desired maximum value for the radiated energy. Both reference signals may be obtained from corresponding nodes A and B of a resistor ladder network coupled to the output of D/A converter 22. For example, the first reference signal (R1) applied to a first input of the comparator 30 may be set to represent a level 0.2 db below the desired signal level, and the second reference signal R2 applied to a second input of the comparator 32 can be set to a level corresponding to 0.2 db above the desired output level. The second input of comparator 30 and the first input of comparator 32 are both connected to the power detector 18.

In operation, the system of FIG. 3 continuously updates the radiation amplitude of the antenna element 10. Also, the element amplitude can be "frozen" (during OFF periods) simply by turning off the clock signal feeding the counter 34. The ladder network at the output of the D/A converter 22 enables a "window" to be formed about the desired reference radiation power level. The FIG. 3 system will cause the output power from the amplifier 12 to be driven within the window and stop. If, for any reason, the power deviates outside the window, the counter 34 will be driven up or down to cause the output power to return within the bounds of the window. The continuous update feature of the FIG. 3 embodiment is realized without any processor intervention.

All of the embodiments described herein inherently fulfill the requirements for so-called "Category III" MLS systems, in which sufficient circuit redundancy must be provided to maintain proper operation of a phased array antenna, notwithstanding a failure at a particular point in the system. For example, each antenna element drive circuit can be provided with a transfer switch at the input of the associated phase shifter 16 to allow transfer to a back-up low level RF source in the event the common source fails. Such a switch can be integrated within the GaAs monolithic circuit, including attenuator 14, power amplifier 12 and power detector 18 associated with each antenna element 10 forming the phased array.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. An amplitude stabilization system for an antenna element, comprising;

amplifier means for supplying radio frequency (RF) energy to an antenna element;

power detector means for detecting the level of RF energy supplied to said antenna element, and for generating a corresponding power level signal;

control means for setting a reference signal corresponding to a desired value for the level of radiated RF energy;

comparing means, responsive to said power level signal and to said reference signal, for producing a first control signal when one of said power level and said reference signals is greater than the other;

a counter being responsive to said first control signal and to a supplied clock signal for generating a second control signal; and attenuator means, coupled to the input of said amplifier means and responsive to said second control signal, for maintaining the level of RF energy radiated by the antenna element at the desired value set by said control means.

2. A stabilization system according to claim 1, wherein said control means includes means for setting a digital control signal corresponding to the desired value of RF energy to be radiated by the antenna element, and a digital-to-analog (D/A) converter for generating said reference signal in response to the digital control signal.

3. A stabilization system according to claim 2, wherein said comparing means comprises a comparator having a first input coupled to the reference signal from said D/A converter and a second input coupled to the power level signal from the power detector means, wherein said comparator produces said first control signal when said power level signal is less than said reference signal.

4. A stabilization system according to claim 1, wherein said counter is resettable, and including means for resetting said counter at predetermined intervals, thereby causing said attenuator means to run from a maximum attenuation setting to a setting corresponding to the desired value for the level of radiated RF energy.

5. A stabilization system according to claim 1, including phase shifter means for setting a desired phase shift to RF energy supplied to an input of said amplifier means, and beam steering means for controlling instantaneous phase shifts set by the phase shifter means over determined time periods.

6. A stabilization system according to claim 5, wherein said beam steering means includes said control means.

7. An amplitude stabilization system for a group of antenna elements in a phased array, comprising:

a plurality of amplifier means, each with an output for supplying radio frequency (RF) energy to a corresponding antenna element of a group of elements in a phased array;

combiner means coupled to the outputs of said amplifier means for sampling the RF energy output from each amplifier means and producing a corresponding output;

power detector means coupled to the output of said combiner means, for generating a combined power level signal corresponding to the level of RF energy supplied to said group of elements;

control means for setting a reference signal corresponding to a desired value of RF energy to be radiated by said group of elements;

comparing means responsive to said combined power level signal and to said reference signal, for producing a first control signal when one of said combined power level and said reference signals is greater than the other;

a counter being responsive to said first control signal and to a supplied clock signal for generating a second control signal; and a plurality of attenuator means, each coupled to a different one of said amplifier means and responsive to said second control signal, for maintaining the level of RF energy radiated by the group of antenna elements at the desired value set by said control means.

8. A stabilization system according to claim 7, wherein said control means includes means for setting a digital control signal corresponding to the desired value of RF energy to be radiated by the antenna element, and a digital-to-analog (D/A) converter for generating said reference signal in response to the digital control signal.

9. A stabilization system according to claim 8, wherein said comparing means comprises a comparator having a first input coupled to the reference signal from said D/A converter and a second input coupled to the combined power level signal from the power detector means, wherein said comparator produces said first control signal when said combined power level signal is less than said reference signal.

10. A stabilization system according to claim 7, wherein each of said amplifier means has an input for receiving RF energy to be amplified and an output for supplying the amplified RF energy to an associated antenna element, and each of said attenuator means is coupled to the input of an associated amplifier means, for controlling the level of RF energy applied to said input.

11. A stabilization system according to claim 7, wherein said counters are resettable, and including means for resetting said counters at predetermined intervals to run from a maximum attenuation setting to a setting just sufficient to obtain the desired value for the level of radiated RF energy.

12. A stabilization system according to claim 7, including a plurality of phase shifter means, each for setting a desired phase shift to RF energy supplied to an input of a corresponding one of said amplifier means, and beam steering means for controlling instantaneous phase shifts set by each of the phase shifter means over determined time periods.

13. A stabilization system according to claim 12, wherein said beam steering means includes said control means.

14. An amplitude stabilization system for an antenna element, comprising:

amplifier means having an output for supplying radio frequency (RF) energy to said antenna element;

power detector means for detecting the level of RF energy supplied to said element, and for generating a corresponding power level signal;

control means for setting a first reference signal corresponding to a desired minimum value for the level of RF energy, and for setting a second reference signal corresponding to a desired maximum value for the level of radiated RF energy;

comparing means, responsive to said power level signal and to said first and second reference signals, for producing a first control signal when said first reference signal is greater than said power level signal and a second control signal when said power level signal is greater than said second reference signal;

a counter being responsive to said first and sais second controls signal and to a supplied clock signal for generating a third control signal; and attenuator means coupled to said amplifier means and responsive to said third control signal, for maintaining the level of RF energy radiated by the antenna element between the desired minimum and maximum values set by said control means.

15. A stabilization system according to claim 14, wherein said control means includes means for setting a digital control signal corresponding to the desired value of RF energy to be radiated by the antenna element, and digital-to-analog (D/A) converter means for generating said first and said second reference signals in response to the digital control signal.

16. A stabilization system according to claim 15, wherein said D/A converter means includes ladder circuit means for producing the first and the second reference signals at corresponding first and second nodes of the ladder circuit means.

17. A stabilization system according to claim 16, wherein said comparing means comprises a first comparator having a first input coupled to the first node of said ladder circuit means and a second input coupled to said power detector means, and a second comparator having a first input coupled to said power detector means and a second input coupled to the second node of said ladder circuit means.

18. A stabilization system according to claim 14, including phase shifter means for setting a desired phase shift to RF energy supplied to an input of said amplifier means, and beam steering means for controlling instantaneous phase shifts set by the phase shifter means over determined time periods.

19. A stabilization system according to claim 18, wherein said beam steering means includes said control means.

* * * * *